(12) United States Patent
Cheng et al.

(10) Patent No.: US 7,005,236 B2
(45) Date of Patent: Feb. 28, 2006

(54) MAINTAINING PHOTORESIST PLANARITY AT HOLE EDGES

(75) Inventors: Su-Jen Cheng, Taipei (TW); Bor-Ping Jang, Ping Tung (TW); Chun-Chieh Wang, Peikang Town (TW); Jy-Jie Gau, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 232 days.

(21) Appl. No.: 10/421,188

(22) Filed: Apr. 23, 2003

(65) Prior Publication Data

US 2004/0214112 A1 Oct. 28, 2004

(51) Int. Cl.
*G03F 7/00* (2006.01)
(52) U.S. Cl. ..................... 430/311; 427/97.8
(58) Field of Classification Search .............. 430/311, 430/312; 427/97.7, 97.8
See application file for complete search history.

(56) References Cited

U.S. PATENT DOCUMENTS

| 5,066,616 | A | * | 11/1991 | Gordon | .................. 430/272.1 |
|---|---|---|---|---|---|
| 5,677,243 | A | | 10/1997 | Ohsaki | ........................ 437/195 |
| 6,042,999 | A | | 3/2000 | Lin et al. | ..................... 430/316 |
| 6,319,821 | B1 | * | 11/2001 | Liu et al. | .................... 438/636 |
| 6,326,296 | B1 | | 12/2001 | Tsai et al. | ................... 438/624 |
| 6,391,800 | B1 | * | 5/2002 | Redd et al. | ................. 438/782 |
| 6,821,896 | B1 | * | 11/2004 | Shih | ........................... 438/692 |
| 2002/0183426 | A1 | * | 12/2002 | Lamb et al. | ................ 524/236 |
| 2003/0030118 | A1 | * | 2/2003 | Kim | ........................... 257/414 |
| 2003/0116528 | A1 | * | 6/2003 | Bernstein et al. | .............. 216/2 |

FOREIGN PATENT DOCUMENTS

JP 522512 3/2003

* cited by examiner

*Primary Examiner*—Kathleen Duda

(57) ABSTRACT

Maintaining photoresist thickness and uniformity over a substrate that includes various cavities presents problems, such as preventing distortion of features in the resist image close to cavity edges. These problems have been overcome by laying down the photoresist as two separate layers. The first layer is used to eliminate or reduce problems associated with the presence of the cavities. The second layer is processed in the normal way and does not introduce distortions close to a cavity's edge. A first embodiment introduces some liquid into the cavity before laying down the first layer while the second embodiment etches away part of the first layer before applying the second one. Application of the process to the formation of a cantilever that overhangs a cavity is also described.

33 Claims, 7 Drawing Sheets

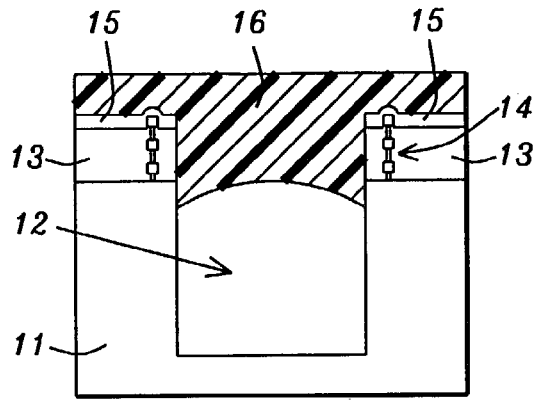
FIG. 1 — Prior Art
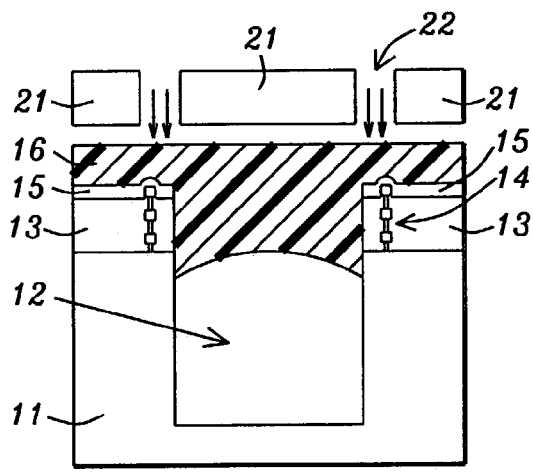
FIG. 2 — Prior Art
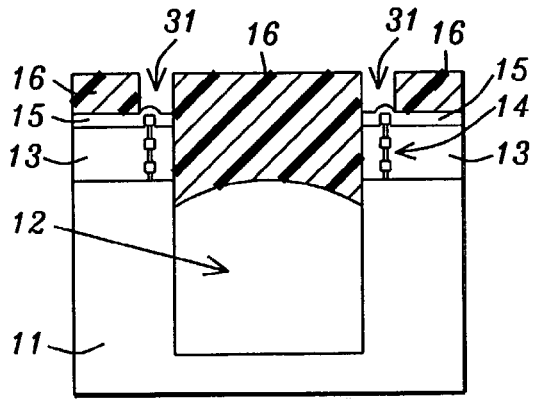
FIG. 3 — Prior Art

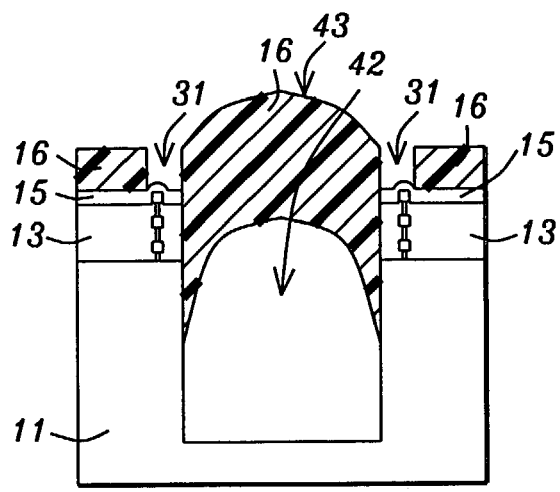
FIG. 4 – Prior Art
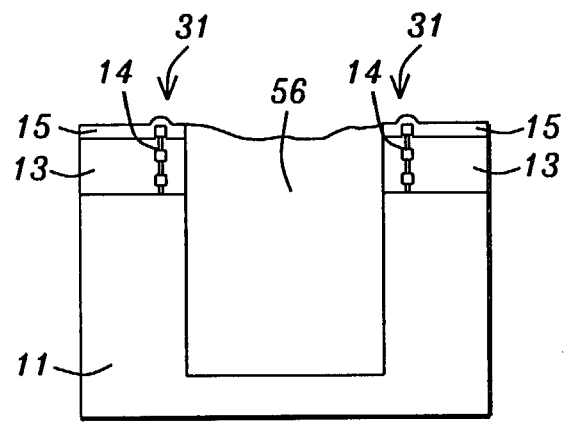
FIG. 5
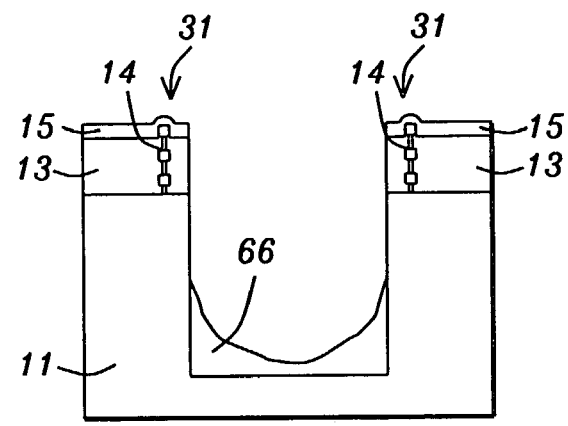
FIG. 6

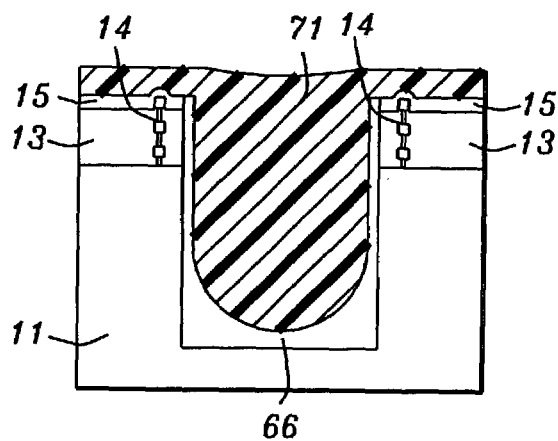
FIG. 7
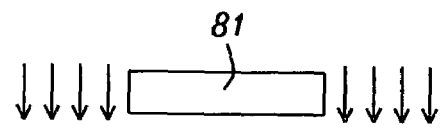
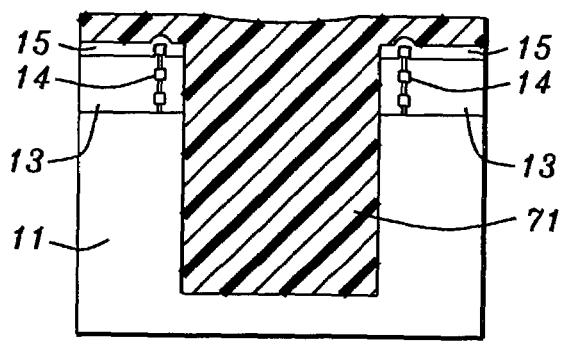
FIG. 8
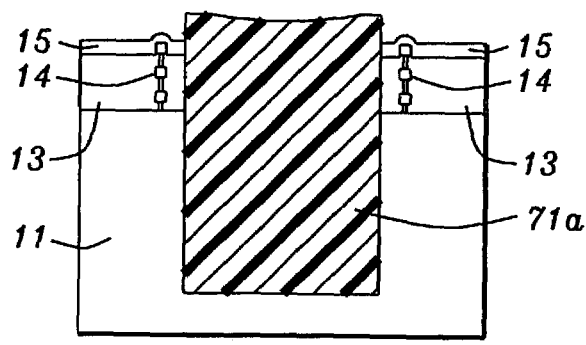
FIG. 9

MAINTAINING PHOTORESIST PLANARITY AT HOLE EDGES

FIELD OF THE INVENTION

The invention relates to the general field of integrated circuits with particular reference to application of photoresist to surfaces in which there are cavities.

BACKGROUND OF THE INVENTION

During the manufacture of custom integrated circuits, it may be required that deep holes be fully filled with photoresist. Maintaining photoresist thickness and uniformity under these conditions often presents a major challenge. In particular, if it is necessary to include, as part of the photoresist image, a feature (such as a hole or an island) that is located within about 25 microns from the edge of a cavity, conventional methods for photoresist coating suffer from three serious problems:

1. Because of its viscosity, the photoresist is unable to completely fill deep holes.
2. Bubbles may get trapped within the photoresist used to fill the holes subsequently leading to cracks generated during routine baking of the resist.
3. Photoresist uniformity is poor close to a high topography border, in particular a cavity in the form of a trench or a via hole or a channel (e.g. for conveying fluid), Referring now to FIG. 1, seen there is a substrate which might typically be made up of a silicon base 11 on whose surface an integrated circuit had been formed. Wiring 14 for said circuit is seen in cross-section as embedded in interdielectric layer 13. At its topmost level is passivation layer 15 which covers the highest wiring level. A cavity has been formed that extends downwards from layer 15 well into the silicon.

Using routine prior art methods, photoresist layer 16 has been spread over the surface with the intention of filling any cavities as well. As shown schematically in FIG. 1, layer 16 does not always fill the cavity fully and uniformly. Instead, air bubble 12 gets trapped within the cavity.

FIG. 2 schematically shows photoresist layer 16 being exposed through mask 21 that includes feature 22 which, after processing, leads to openings 31 in the resist directly above wiring 14, as seen in FIG. 3.

Following resist development, the structure gets baked in order to dry and harden the resist. One side effect of this heat treatment is the expansion of the trapped bubble to become bubble 42, as seen in FIG. 4. The upward movement of resist 16 to a new peak height 43 becomes permanent because of the resist hardening so, even after cooling, openings 31 have become distorted and uneven so that subsequent attempts to etch through them, or to use them as molds, produce poor results.

The present invention teaches how this problem can be overcome.

A routine search of the prior art was performed with the following references of interest being found:

In U.S. Pat. No. 6,326,296 B1, Tsai et al. show a process where a dual damascene hole is filled with photoresist by using a protective material to protect the side of the hole. Oshaki et al. in U.S. Pat. No. 5,677,243 reveal a process where an organic material is used as a temporary filling in a dual damascene process. U.S. Pat. No. 6,042,999 (Lin et al.) teaches a process where a resist fills the trench hole as a protective measure.

SUMMARY OF THE INVENTION

It has been an object of at least one embodiment of the present invention to provide a process for filling a cavity with photoresist.

Another object of at least one embodiment of the present invention has been that said process facilitate the formation of features in photoresist that are located very close to the edge of a cavity.

Still another object of at least one embodiment of the present invention has been that said process be applicable to the formation of a cantilever structure that extends over a cavity while being anchored very close to an edge of said cavity.

These objects have been achieved by laying down the photoresist as two separate layers. The first layer is used to eliminate or reduce problems associated with coating a surface that includes cavities. The second layer is processed in the normal way and does not introduce distortions close to a cavity's edge. A first embodiment introduces some liquid into the cavity before laying down the first layer while the second embodiment etches away part of the first layer before applying the second one. Application of the process to the formation of a cantilever that overhangs a cavity is also described.

BRIEF DESCRIPTION OF THE DRAWINGS

FIGS. 1–4 illustrate prior art processes for filling narrow cavities with photoresist.

FIG. 5 is the starting point for a first embodiment of the invention.

FIG. 6 shows a cavity after it has been filled with liquid and then most of the liquid removed.

FIG. 7 illustrates how the cavity of FIG. 6 fills uniformly with photoresist.

FIGS. 8–10 show how, after development, the photoresist extends too far above the lip of the cavity but, after a key baking step is introduced, it becomes coplanar therewith.

DESCRIPTION OF THE PREFERRED EMBODIMENTS

Figure 10:
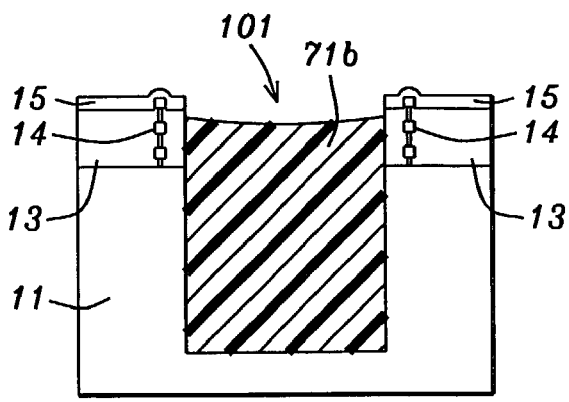

We will describe the invention in terms of photoresist but it should be understood that the invention is more general than this and is applicable to any material that is radiation-sensitive and patternable.

Referring now to FIG. 5, a first embodiment of the process of the present invention begins with the provision a substrate (base 11 together with layers 13 and 15 in this example) in whose upper surface there is a cavity in the form of a trench, a via hole, or liquid channel. The cavity has a depth between about 15 and 25 microns and a width between about 13 and 18 microns. In a departure from prior art practice, the next step is to fill this cavity with liquid 56 that dissolves photoresist and wets the cavity's floor and sidewalls. Typical examples of such a liquid include (but are not limited to) OK73 Thinner, propylene glycol monomethyl ether 7%, and propylene glycol monomethyl ether acetete.

Next, most of liquid 56 is removed from within the cavity (preferably by, but not limited to, spinning) so that, as seen in FIG. 6, only a shallow layer 66 remains. However, some liquid continues to coat the floor and sidewalls of the cavity. This remaining layer of liquid has a thickness up to about 0.5 microns. This is followed by a first application of photoresist, shown as layer 71 in FIG. 7, to a thickness between about 28 and 30 microns. Because the floor and sidewalls of the cavity have been pre-wetted, there are no attendant voids or bubbles in the photoresist.

Referring next to FIG. 8, layer 71 is now exposed through mask 81 that shields only material that is in the cavity and not outside it so that, after development, layer 71 (now designated as 71a) has the appearance illustrated in FIG. 9. In particular, note that photoresist layer 71a has an upper surface that is above the level of the cavity's external lip or edge. Although this example was for a positive resist the process would work just as well if a negative resist had been used (with a mask that is the negative of 81).

Next, in a key feature of the invention, the structure is baked. Baking is performed by heating at a temperature between about 150 and 200° C. for between about 2 and 5 minutes. This causes the photoresist to shrink (becoming layer 71b in FIG. 10) so that its upper surface 101 is now coplanar with the aforementioned lip. The result is that the original cavity has been filled with no internal cracks or bubbles and with an upper surface that is coplanar with the substrate surface.

Figure 11:
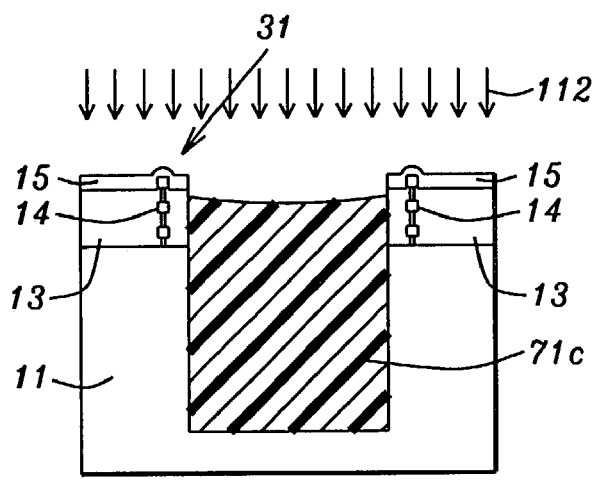
FIG. 11 shows an ashing step to remove unexposed resist and to prime the surface of the remaining resist.

Continuing now where the first embodiment left off, for a second embodiment of the invention, layer 71b is subjected to an oxygen ashing treatment (heating in ozone at about 140° C. for between about 1 and 3 minutes) as symbolized by arrows 112 in FIG. 11, becoming, now, layer 71c. This treatment has two effects—any photoresist that did not get exposed (but survived development) is now removed and the surface of 71c becomes primed for improved adhesion to a second layer of photoresist.

Figure 12:
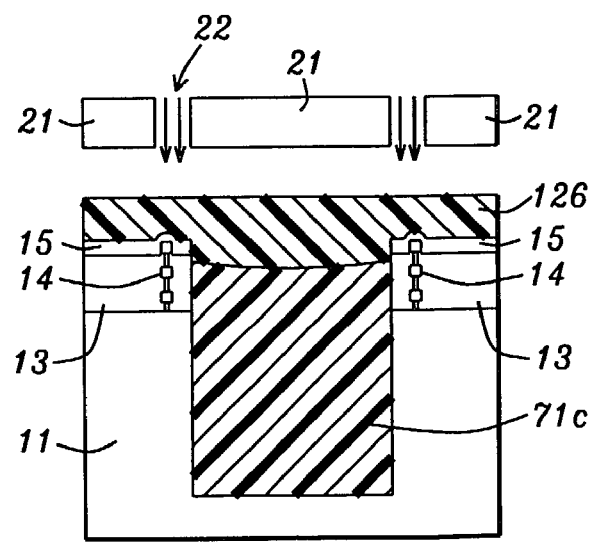
FIGS. 12 and 13 show how a second layer of resist can now be added and patterned to include, without distortion, features very close to the edge of the cavity.
Figure 13:
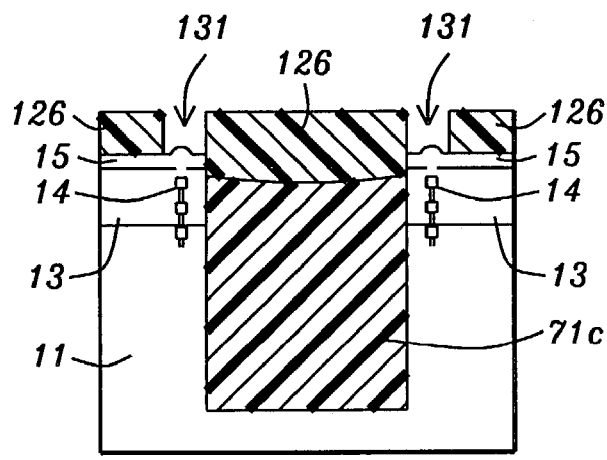

Moving on to FIG. 12, said second photoresist layer is now applied in the usual way (designated as layer 126 and given a thickness between about 2 and 4 microns) and then exposed through mask 21 which includes feature 22 (such as an opening or an island) and which, after processing, leads to openings 131 in the resist directly above wiring 14, as seen in FIG. 13. The similarity to the process steps illustrated by FIGS. 1–3 is not accidental. However, since the bulk of the photoresist (71c) has already been baked and since there are no trapped air bubbles, additional baking of layer 126 does not introduce surface distortions of the type seen in FIG. 4 (of the prior art). Consequently, the process of the present invention makes possible the formation of an image feature in photoresist that is located right at the edge of a cavity.

A third embodiment of the invention is a variation of the first and second embodiments, achieving the same end result. As before, it begins with the provision of a substrate in whose upper surface the cavity is present. A first layer of photoresist is then applied and dried in a conventional manner to a thickness between about 25 and 30 microns.

Figure 14:
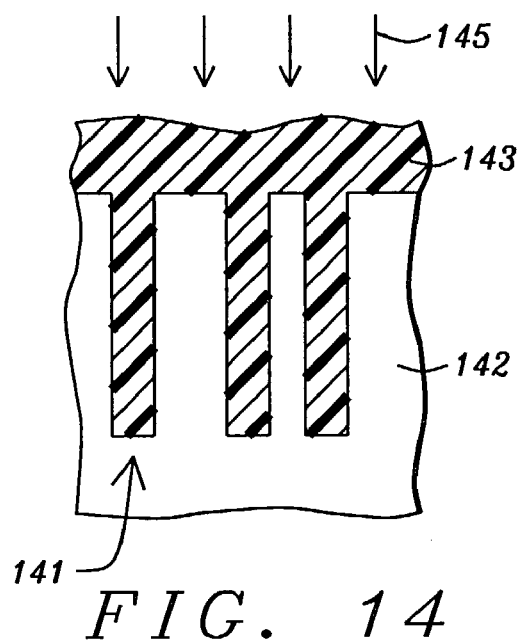
FIG. 14 is the starting point for another embodiment, showing several cavities filled with photoresist.
Figure 15:
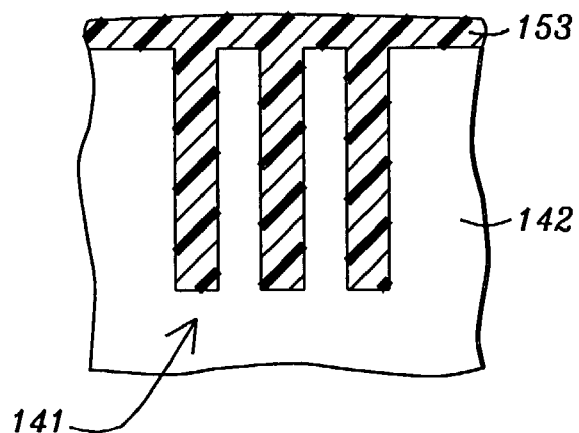
FIG. 15 is FIG. 14 with part of said photoresist layer having been etched away.

Then, in a departure from the prior art, this first layer of photoresist is etched until some fraction (typically between about 20 and 25%) of its thickness still remains. This is schematically illustrated in FIG. 14 where substrate 142, that includes cavities such as 141 (trenches in this example), is seen covered by first photoresist layer 143. The etching process for removing part of 143 is symbolized by arrows 145. Its main features are oxygen ashing at 250° C. for 2 minutes.

Figure 16:
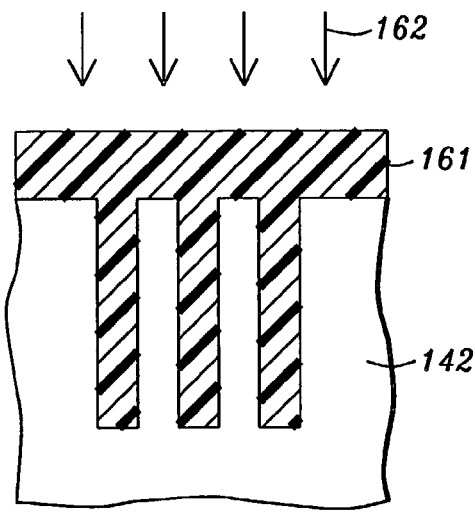
FIG. 16 illustrates the laying down of a second resist layer which is then patterned and processed in a conventional manner.
Figure 17:
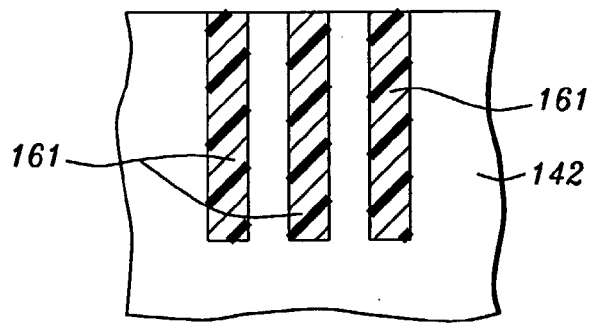
FIG. 17 shows the structure of FIG. 16 with the cavities just filled with resist.

Referring now to FIG. 16, second layer of photoresist is applied over remaining layer 153 (to a thickness between about 2 and 4 microns), the combination of first and second photoresist layers being designated as layer 161. The latter is then processed in the usual way, arrows 162 symbolizing exposure of 161 through a mask. Depending on the choice of mask, layer 161 may be patterned to allow cavities 141 to be just filled with photoresist (as illustrated in FIG. 17) or features very close to a cavity's edge may be imaged in the resist without distortion (not shown, see FIG. 13).

In a fourth embodiment of the invention, the second and/or third embodiments are applied to the problem of forming a cantilever structure that overhangs a cavity while being anchored very close to that cavity's edge. Although the process of the second embodiment could have been used, we will assume, for purposes of illustration, that the process of the first embodiment was applied to a single cavity, as illustrated in FIGS. 5 through 11, but in the absence of features such as 31.

Figure 18:
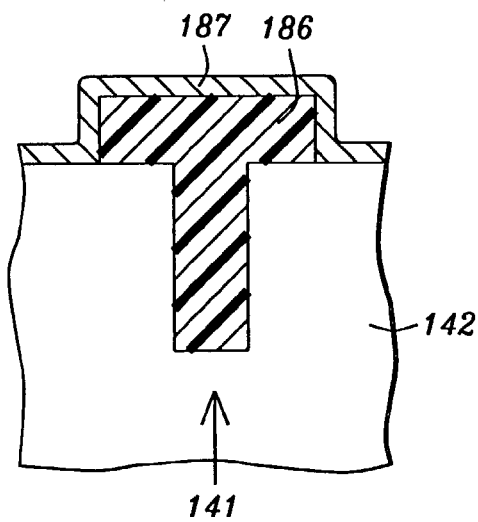
FIGS. 18–20 illustrate the application of the previous embodiments to the formation of a cantilever structure that overhangs a cavity.
Figure 19:
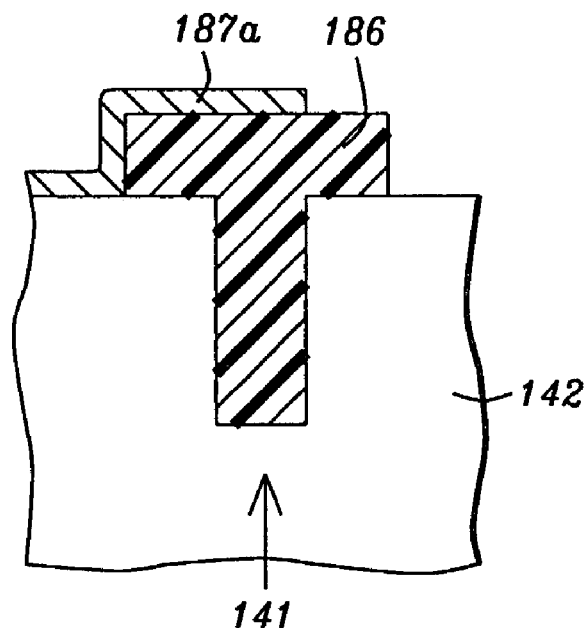

After second photoresist layer 126 has been applied, it is patterned in the usual way so that an island of exposed and developed photoresist 186 fully covers and overlaps cavity 141, as seen in FIG. 18. Layer 187 of a suitable material (such as TiN, AlCu, Au, or $Si_3N_4$) is then deposited onto the substrate, including island 186. Layer 187 has a thickness between about 0.25 and 0.75 microns.

Figure 20:
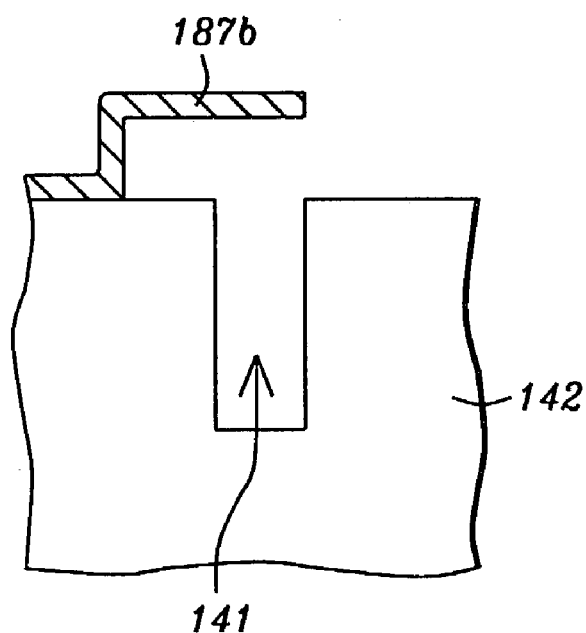

Layer 187 is then itself patterned so that it extends across only one side of island 186 (being now designated as 187a). How far 187a ends from the opposing edge of 186 becomes a matter of design choice. The process concludes with the removal of all photoresist which results in the formation of cantilever 187b as seen in FIG. 20. A key aspect of the invention is that this cantilever may be attached to the substrate at a location that is less than about 5 microns from the cavity's edge.

What is claimed is:

1. A process to fill a cavity, comprising:
   providing a substrate in whose upper surface said cavity is present;
   wetting said cavity with a chemical;
   removing most of said chemical from said cavity to form a substantially void cavity;
   forming a first layer of radiation-sensitive material that is soluble in said chemical, including filling said substantially void cavity with said radiation-resistive material;
   patterning said first layer of radiation-sensitive material;
   applying a second layer of radiation-sensitive material; and
   patterning said second layer of radiation-sensitive material whereby it fills said cavity.

2. The process described in claim 1 wherein said radiation-sensitive materials are photoresist.

3. The process described in claim 1 further comprising baking said first layer of radiation-sensitive material before applying said second layer of radiation sensitive material.

4. The process described in claim 3 wherein the step of baking said first layer of radiation-sensitive material further comprises heating at a temperature between about 150 and 200° C. for between about 2 and 5 minutes.

5. The process described in claim 1 wherein any chemical remaining in said cavity after most of said chemical has been removed, has a thickness less than about 0.5 microns.

6. The process described in claim 1 wherein said cavity is a trench, a via hole, or a liquid channel.

7. The process described in claim 1 wherein said cavity has a depth between about 15 and 25 microns and a width between about 13 and 18 microns.

8. The process described in claim 1 further comprising an oxygen ashing step.

9. A process to fill a cavity with photoresist, comprising:
providing a substrate in whose upper surface said cavity is present, said cavity having a floor, sidewalls, and a lip;
filling said cavity with a liquid that dissolves photoresist and wets said floor and sidewalls;
removing most of said liquid from said cavity to form a substantially void cavity with a layer of said liquid remaining to coat said floor and sidewalls;
applying a first layer of photoresist to said upper surface whereby said cavity fills with photoresist, there being no attendant voids or bubbles in the photoresist;
patterning and then developing said first layer of photoresist whereby all photoresist not in said cavity is removed and said first photoresist layer has an upper surface that is above the level with said lip;
then baking said first layer on photoresist whereby shrinkage occurs and said first photoresist layer's upper surface becomes coplanar with said lip;
then subjecting said first layer of photoresist to an oxygen ashing treatment whereby any remaining and unexposed photoresist is removed and said first layer of photoresist has a surface that is primed for adhesion to another layer of photoresist.
then applying a second layer of photoresist over said substrate; and
exposing and developing said second layer of photoresist whereby said second photoresist layer has an upper surface that is coplanar with said lip.

10. The process described in claim 9 wherein the step of baking said first layer of photoresist further comprises heating at a temperature between about 150 and 200° C. for between about 2 and 5 minutes.

11. The process described in claim 9 wherein said layer of liquid that continues to coat said floor and sidewalls has a thickness that is less than about 0.5 microns.

12. The process described in claim 9 wherein said cavity is a trench, a via hole, or a liquid channel.

13. The process described in claim 9 wherein said cavity has a depth between about 15 and 25 microns and a width between about 13 and 18 microns.

14. A process to form, in photoresist, a feature located near a cavity, comprising:
providing a substrate in whose upper surface said cavity is present, said cavity having a floor, sidewalls, and a lip;
filling said cavity with a liquid that dissolves photoresist and wets said floor and sidewalls;
removing most of said liquid from said cavity to form a substantially void cavity with a layer of said liquid remaining to coat said floor and sidewalls;
applying a first layer of photoresist to said upper surface whereby said cavity fills with photoresist, there being no attendant voids or bubbles in the photoresist;
patterning and then developing said first layer of photoresist whereby all photoresist not in said cavity is removed and said first photoresist layer has an upper surface that is above the level with said lip;
then baking said first layer of photoresist whereby shrinkage occurs and said first photoresist layer's upper surface becomes coplanar with said lip;
then subjecting said first layer of photoresist to an oxygen ashing treatment whereby any remaining and unexposed photoresist is removed and said first layer of photoresist has a surface that is primed for adhesion to another layer of photoresist;
then applying a second layer of photoresist over said substrate; and
patterning said second layer of photoresist whereby an image is formed in it, said image including a feature on said lip located right at said cavity.

15. The process described in claim 14 wherein the step of baking said first layer of photoresist further comprises heating at a temperature between about 150 and 200° C. for between about 2 and 5 minutes.

16. The process described in claim 14 wherein said layer of liquid that continues to coat said floor and sidewalls has a thickness less than about 0.5 microns.

17. The process described in claim 14 wherein said cavity is a trench, a via hole, or liquid channel.

18. The process described in claim 14 wherein said cavity has a depth between about 15 and 25 microns and a width between about 13 and 18 microns.

19. The process described in claim 14 wherein said feature is an opening or an island.

20. A process to form, in radiation sensitive material, a feature located near a cavity, comprising:
providing a substrate in whose upper surface said cavity is present;
applying a first layer of radiation sensitive material to said upper surface including said cavity;
drying said first layer of radiation sensitive material;
then etching said first layer of radiation sensitive material until a fraction of its thickness remains;
then applying a second layer of radiation sensitive material over said remaining first layer, thereby forming a bilayer;
patterning said bilayer whereby an image is formed therein, said image including a feature located right at said cavity;
depositing and patterning a layer of material so that it extends over said feature and over said cavity: and
then removing all radiation-sensitive material thereby forming a cantilever structure over said cavity.

21. The process described in claim 20 wherein said first layer of radiation sensitive material has a thickness between about 25 and 30 microns.

22. The process described in claim 20 wherein said second layer of radiation sensitive material has a thickness between about 2 and 4 microns.

23. The process described in claim 20 wherein said cavity is a trench, a via hole, or a liquid channel.

24. The process described in claim 20 wherein said cavity has a depth between about 15 and 25 microns and a width between about 13 and 18 microns.

25. The process described in claim 20 wherein said feature is an opening or an island.

26. The process described in claim 20 wherein the step of etching said first layer of radiation sensitive material further comprises ashing in oxygen at about 250° C. for about 2 minutes.

27. The process described in claim 20 wherein said fraction of first radiation sensitive material thickness that remains is between about 20 and 25%.

28. A process to form a cantilever structure over a cavity, comprising:

providing a substrate in whose upper surface said cavity is present, said cavity having a floor, sidewalls, and a lip;

wetting said cavity with a chemical that dissolves radiation sensitive material and wets said floor and sidewalls;

removing most of said chemical from said cavity whereby a layer of said chemical continues to coat said floor and sidewalls;

applying a first layer of radiation sensitive material to said upper surface whereby said cavity fills with radiation sensitive materials, there being no attendant voids or bubbles in the radiation sensitive material;

patterning and then developing said first layer of radiation sensitive material whereby all radiation sensitive material not in said cavity is removed and said first radiation sensitive material layer has an upper surface that is above the level with said lip;

then applying a second layer of radiation sensitive material and patterning said second layer of radiation sensitive material to form an island, having opposing sides, that fully covers and overlaps said cavity;

depositing a layer of material on said substrate, including said island;

patterning said layer of material so that it extends over only one of said opposing sides; and then removing all radiation sensitive material, thereby forming said cantilever structure.

29. The process described in claim 28 further comprising the steps of:

baking said first layer of radiation sensitive material whereby shrinkage occurs and said first radiation sensitive material layer's upper surface becomes coplanar with said lip; and then subjecting said first layer of radiation sensitive material to an oxygen ashing treatment whereby any remaining and unexposed radiation sensitive material is removed and said first layer of radiation sensitive material has a surface that is primed for adhesion to another layer of radiation sensitive material.

30. The process described in claim 28 wherein said second layer of radiation sensitive material has a thickness between about 2 and 4 microns.

31. The process described in claim 28 wherein said layer of material is TiN, AlCu, Au, or $Si_3N_4$.

32. The process described in claim 28 wherein said layer of material has a thickness between about 0.25 and 0.75 microns.

33. The process described in claim 28 wherein said cantilever is attached to the substrate at a distance less than about 5 microns from said cavity's edge.

* * * * *